United States Patent [19]
Johnson

[11] Patent Number: 4,493,418
[45] Date of Patent: Jan. 15, 1985

[54] WAFER PROCESSING CASSETTE

[75] Inventor: Douglas M. Johnson, Waconia, Minn.

[73] Assignee: Empak Inc., Chanhassen, Minn.

[21] Appl. No.: 523,851

[22] Filed: Aug. 17, 1983

[51] Int. Cl.³ .................... B65D 25/28; B65D 85/30; B65D 1/34; B65G 3/00
[52] U.S. Cl. .................................. 206/454; 118/500; 211/40; 206/328; 220/83
[58] Field of Search .............. 206/454, 328; 220/83; 211/40; 118/500

[56] References Cited

U.S. PATENT DOCUMENTS

| | | | |
|---|---|---|---|
| 3,923,156 | 12/1975 | Wallestad | 211/40 |
| 3,926,305 | 12/1975 | Wallestad | 206/454 |
| 3,934,933 | 1/1976 | Worden | 118/500 |
| 3,939,973 | 2/1976 | Wallestad | 206/454 |
| 3,961,877 | 6/1976 | Johnson | 206/454 |

Primary Examiner—William T. Dixson, Jr.
Attorney, Agent, or Firm—Hugh D. Jaeger

[57] ABSTRACT

Wafer cassette for processing of wafers which includes a plurality of open supported wafer dividers for supporting a plurality of wafers in alignment in opposing dividers of the cassette for automated processing of the wafers while in the cassette. The wafer cassette utilizes an H-bar end with a configured rod reinforced open front which is fully functional and strategically located. The dividers are supported by longitudinal horizontal supports secured to the ends providing for open area between each of the dividers for passage of liquids during automated processing. The cassette provides open area about the H-bar end. The rear end which includes a downward arch and through the dividers for open, non-restricted automated processing of wafers. The processing wafer cassette provides for "on-center" processing where the carrier center of gravity is on-center of the axis of centrifugal wafer processing machinery.

3 Claims, 5 Drawing Figures

WAFER PROCESSING CASSETTE

BACKGROUND OF THE INVENTION

1. Field of the Invention

The present invention relates to a wafer cassette for processing of silicon wafers utilized in integrated circuits, and more particularly, pertains to a wafer cassette for carrying a plurality of silicon wafers for integrated circuit processing in known processes including on-center, centrifugal, bath emersion, and in-line one-wafer-at-a-time processing.

2. Description of the Prior Art

The prior art wafer cassettes have been heavy, bulky and expensive, and containing specific structural material not providing for open area for processing of the wafers. The prior art cassettes block spray patterns and processing liquids, and also are of light structural strength such that the prior art cassettes would break during the processing, destroying the silicon wafers. The profiles of the prior art wafer cassettes were high and were of considerable weight, and lacked the structural integrity required for high yield of integrated circuits in automated integrated circuit processing equipment.

The present invention overcomes the disadvantages of the prior art by providing a wafer processing cassette for processing of silicon wafers or the like which includes an H-bar end, a low profile of structure providing for maximum open surface area and perimeter when spraying, open areas between each of the dividers, and provides for on-center processing of integrated circuit wafers in automated integrated circuit processing equipment. The present invention provides a wafer processing cassette for all avenues of processing. The wafer processing cassette is made from Teflon which withstands chemical etching process in addition to being accepted by wafer automated machines.

SUMMARY OF THE INVENTION

The general purpose of the present invention is to provide a wafer cassette for processing of integrated circuit wafers such as silicon wafers or the like which provides a low-profile structure for on-center processing of the cassette by advanced generation integrated circuit wafer processing equipment. The wafer processing cassette includes an integral structure of the cassette with strategically located components of the H-bar end and wafer dividers providing for open, non-restricted areas for integrated circuit processing. Also, the wafer cassette is of an extremely low profile and of minimal weight, which provides for a lower unit cost to the integrated circuit processor.

According to one embodiment of the present invention there is provided a wafer cassette for processing of integrated circuit wafers such as silicon wafers including a substantially rectangular configured H-bar front end including a ramped upper portion, a rounded lower portion, and a partial cylindrical rod running the longitudinal length of the center of the H-bar end, a plurality of wafer dividers having the shape of teeth supported by upper and lower opposing horizontal longitudinal structural supports secured to the front H-bar support and a rear end having a downward arch, a reinforced bottom edge, including a plurality of opposing indexing grooves, and angled rounded opposing sides above the reinforced edge for perimeter contact, whereby the open H-bar end and downward arch rear end provide for maximum open end areas, the open dividers provide for maximum surface area for processing functions thereby providing a fully functional strategically located low-profile least weight wafer cassette for on-center processing of integrated circuit wafers. The H-bar front end is a partial cylindrical rod including a reduced cross-section on a mid-portion thereof.

One significant aspect and feature of the present invention is a wafer cassette which is fully functional and includes a strategically located H-bar end, for structural integrity and open area for non-restricting processing of silicon wafers for integrated circuits.

Another significant aspect and feature of the present invention is a wafer cassette which provides for on-center processing of integrated circuits. The wafer cassette provides that the center of gravity of the wafer cassette carrier is on-center of the axis of integrated circuit centrifugal processing machinery.

A further significant aspect and feature of the present invention is a wafer cassette which provides open surface area and open perimeters when utilizing spray integrated circuit processing equipment.

An additional significant aspect and feature of the present invention is a wafer cassette which has an extremely low profile and is of minimal weight with maximum structural integrity for automated processing equipment.

A still additional significant aspect and feature of the present invention is an H-bar end expressly for industry standard processing and automatic wafer handling equipment. Industry standard equipment requires the standard H-bar configuration profile, and this H-bar falls within the required industry profile for automated processing equipment.

Still another significant aspect and feature of the present invention are sloping and rounded surfaces and corners for drainage of fluids from the surfaces. The corners are smooth and filled thereby preventing particle or particulate contamination during processing of the wafers.

Having thus described embodiments of the present invention, it is a principal object hereof to provide a wafer cassette for integrated circuit processing such as silicon wafers.

One object of the present invention is a fully functional, on-center processing wafer cassette which provides for non-restrictive processing during automated steps of integrated circuit wafer processing.

An additional object of the present invention is a wafer processing cassette which is mass produced from Teflon at an economical price cost, and which withstands high temperatures and sulfuric acid. Also, Teflon cassettes are industry accepted.

BRIEF DESCRIPTION OF THE DRAWINGS

Other objects and many of the attendant advantages of the present invention will be readily appreciated as the same becomes better understood by reference to the following detailed description when considered in connection with the accompanying drawings, in which like reference numerals designate like parts throughout the figures thereof and wherein.

DESCRIPTION OF PREFERRED EMBODIMENTS

Figure 1:
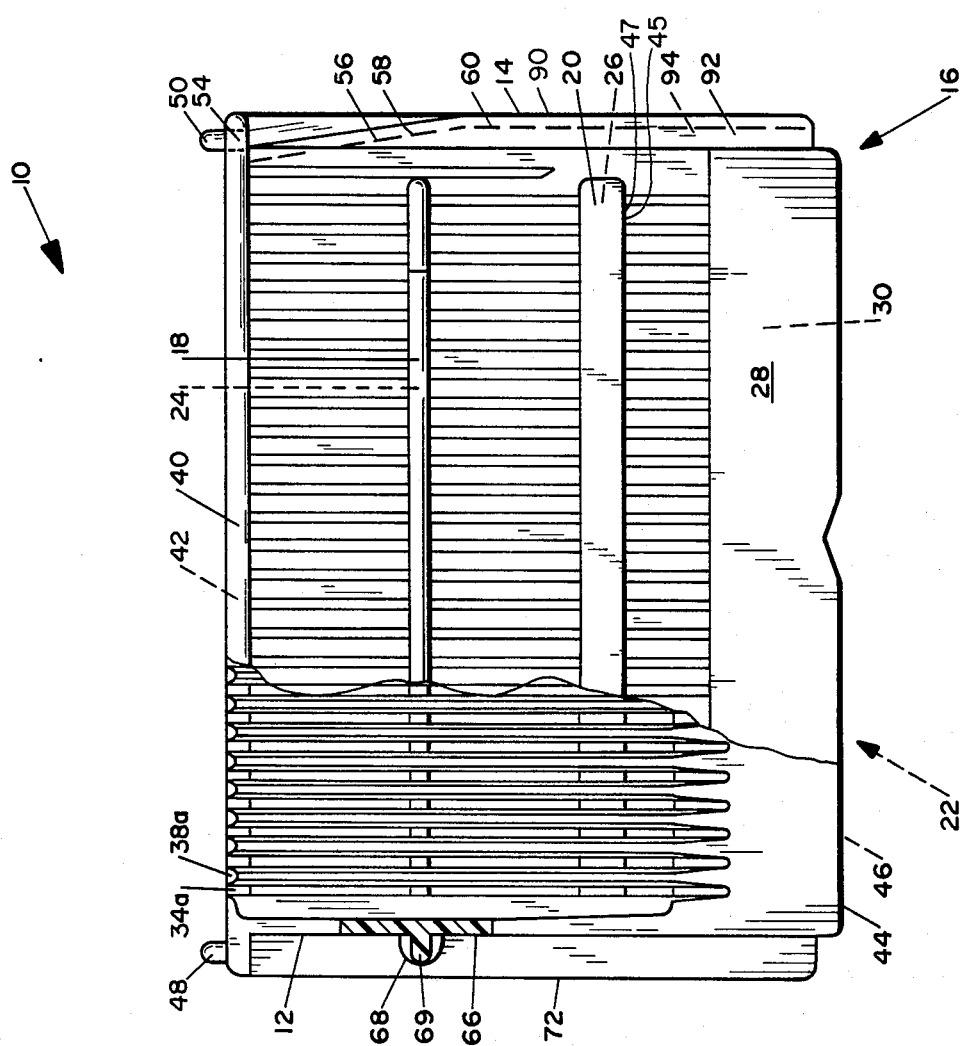
FIG. 1 illustrates a plan view of a wafer processing cassette including a portion partially cut away.
Figure 2:
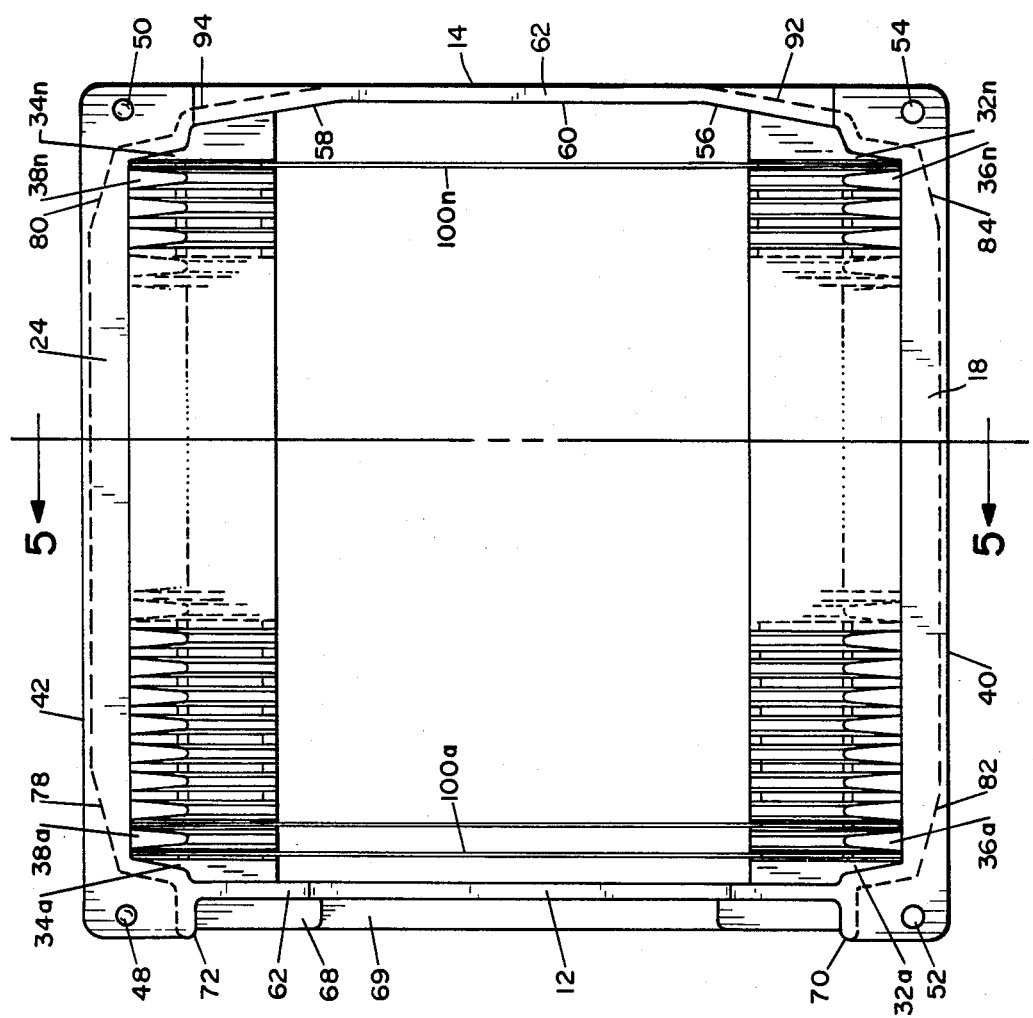
FIG. 2 illustrates a top view.

FIG. 1 illustrates a plan view of a wafer processing cassette 10, the present invention, for processing of integrated circuit wafers such as silicon wafers, including a partially cut away section. The wafer cassette 10 includes an H-bar end 12, also illustrated in FIG. 3 and which includes open area, a rear end 14, also illustrated in FIG. 4, which includes open area, a right side 16 including a right upper horizontal structural support 18 and a right lower horizontal structural support 20, a left side 22 including left upper structural support and left lower horizontal structural support 24 and 26 respectively, and reinforced right and left lower edges 28 and 30. A plurality of right indexing slots 32a–32n and left indexing slots 34a–34n opposing the right indexing slots are also provided in the lower edges. A plurality of wafer dividers assuming the geometrical shapes of rounded teeth 36a–36n and 38a–38n are in opposing alignment with respect to each other, as also shown in FIG. 2, and are supported by the structural supports 18 and 20 and structural wafer supports 24 and 26, upper edge members 40 and 42 and lower edge members 44 and 46 which extend between the front and rear ends 12 and 14 respectively. The horizontal structural supports as well as the dividers correspond to the geometry of the radial circumference of the wafer providing perimeter contact with the wafer and in this particular instance corresponds to a four-inch diameter wafer. Rounded lower support horizontal edges 45 and 47 connect between the ends and provide additional perimeter edge support to the wafers as illustrated in FIG. 3.

The wafer processing cassette 10 includes processing locating pins 48 and 50, and processing locating holes 52 and 54. The cassette 10 also includes opposing angled interior sides 56 and 58 and an angled interior end 60. The H-bar end 12 includes a ramped top edge open area 62 and a rounded lower edge open area 64, as illustrated in FIG. 3. The H-bar center 66 includes a partial section of cylindrical rod 68 and a reduced further mid-portion cross-section cylindrical partial rod 69. Vertical edge bars on the right side 70 and on the left side 72 provide for additional support and bearing surfaces. The rear end 14 includes a downward arch 76 providing for open area in the rear. These elements are also illustrated in FIGS. 2–4. The geometrically configured H-bar with the reduced cross-section provides the required structural integrity.

FIG. 2 illustrates a top view of a wafer cassette 10 where all numerals correspond to those elements previously described. Particularly, wafers 100a–100n are illustrated supported in between the wafer dividers 36a–36n and 38a–38n. The top view also illustrates the geometrical section of the wafer teeth as well as the locating pins and locating holes. Angle sides 78, 80, 82 and 84 are illustrated adjacent to each respective end providing for minimum weight of the cassette.

Figure 3:
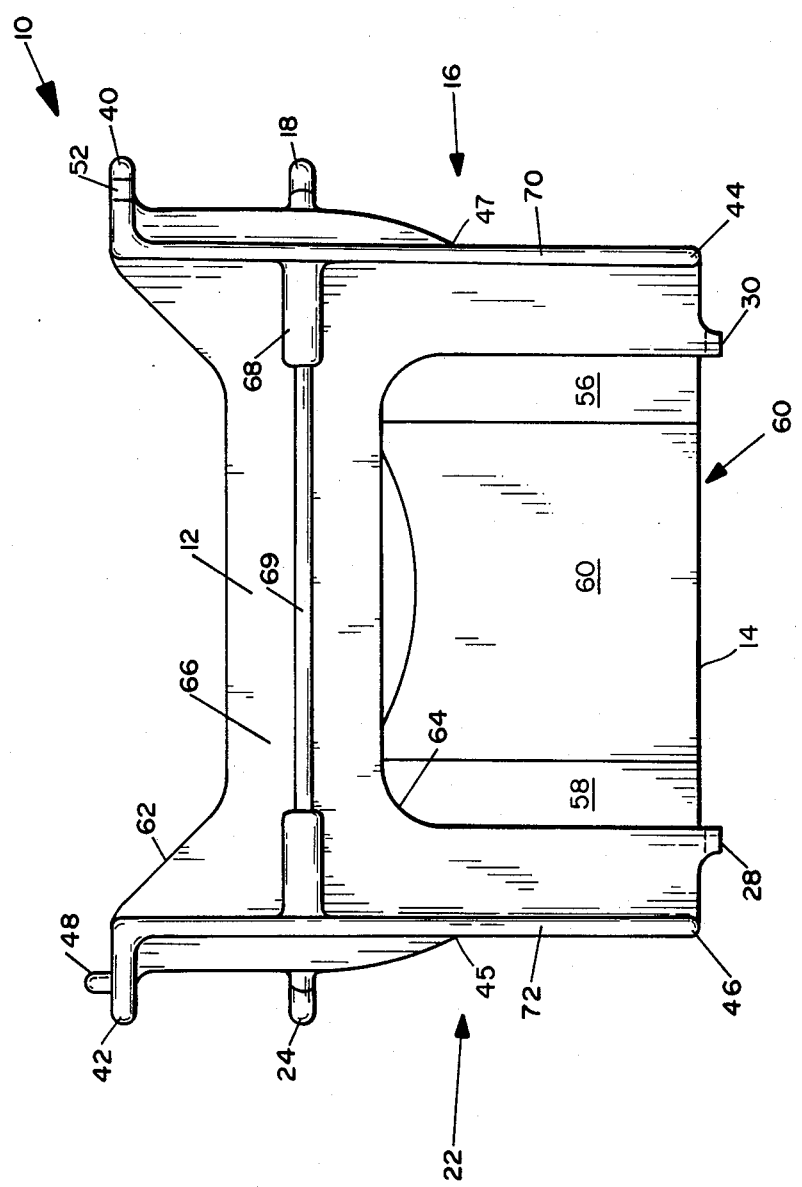
FIG. 3 illustrates the H-bar end front view.
Figure 4:
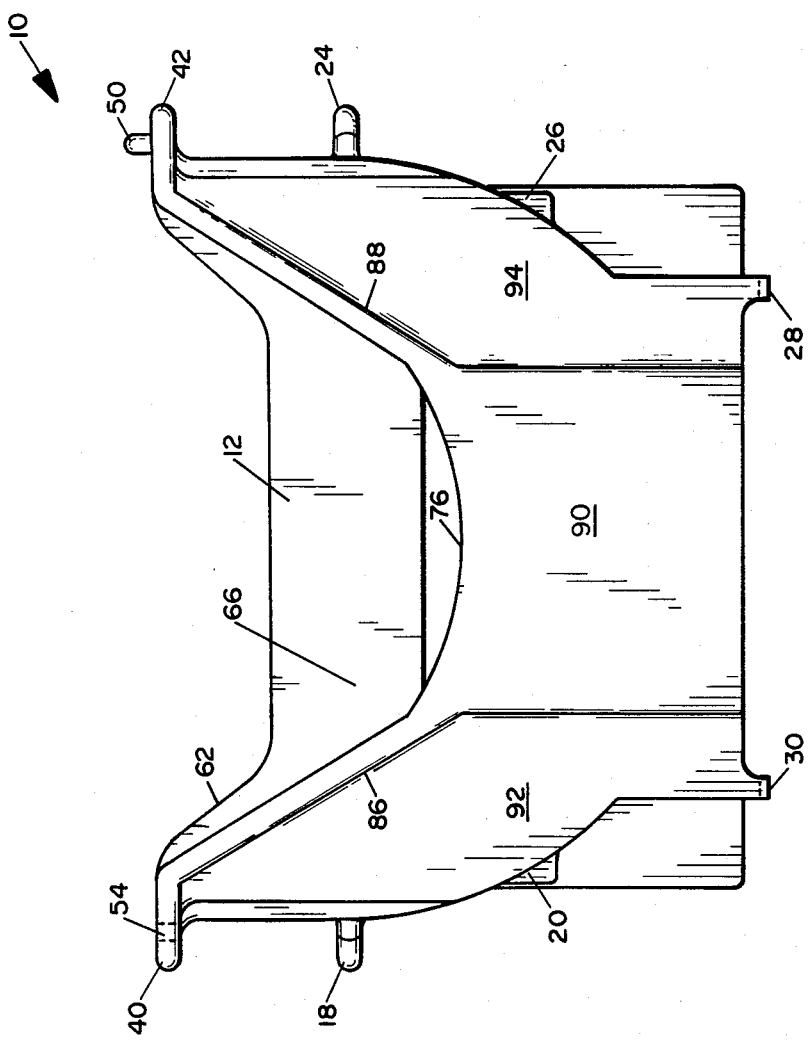
FIG. 4 illustrates a rear end view.

FIG. 3 illustrates a front view of the H-bar end 12, where all numerals correspond to those elements previously described. The particular ramped portion 62 as well as the rounded portion 64 is illustrated along with the supporting cylindrical rod 68, all contributing to structural support and strength of the wafer processing cassette 10.

The profiled H-bar end 68 with partial cylindrical rod 69 provides structural support thereacross.

The sides 70 and 72 provide and act as bearing surfaces. The cassette can be utilized in an upright position during automated wafer processing when the cassette is in a horizontal mode. The H-bar end suffices for 80% of available equipment in automated wafer processing, and is the most popular by industry standards.

FIG. 4 illustrates a rear end view of the wafer cassette 10 where all numerals correspond to those elements previously described. Particularly illustrated is the rounded open area reversed arch 76 providing the open portion. Reinforcing edges 86 and 88 provide for additional rear-end structural support and connect to surface rear 90. The surfaces 86, 88 and 90 also serve as bearing surfaces. Surfaces 92 and 94 also provide for rear-end support as illustrated.

MODE OF OPERATION

The wafers 100 are positioned into the wafer cassette 10 for processing, and which can also be used for storage or for transportation. The intended purpose of the present invention, though, is for automated processing. The wafer cassette 10 can be utilized on-center processing equipment or other types of processing equipment. The wafer cassette 10 is unique in being functional for all types of processing equipment for integrated circuits.

Figure 5:
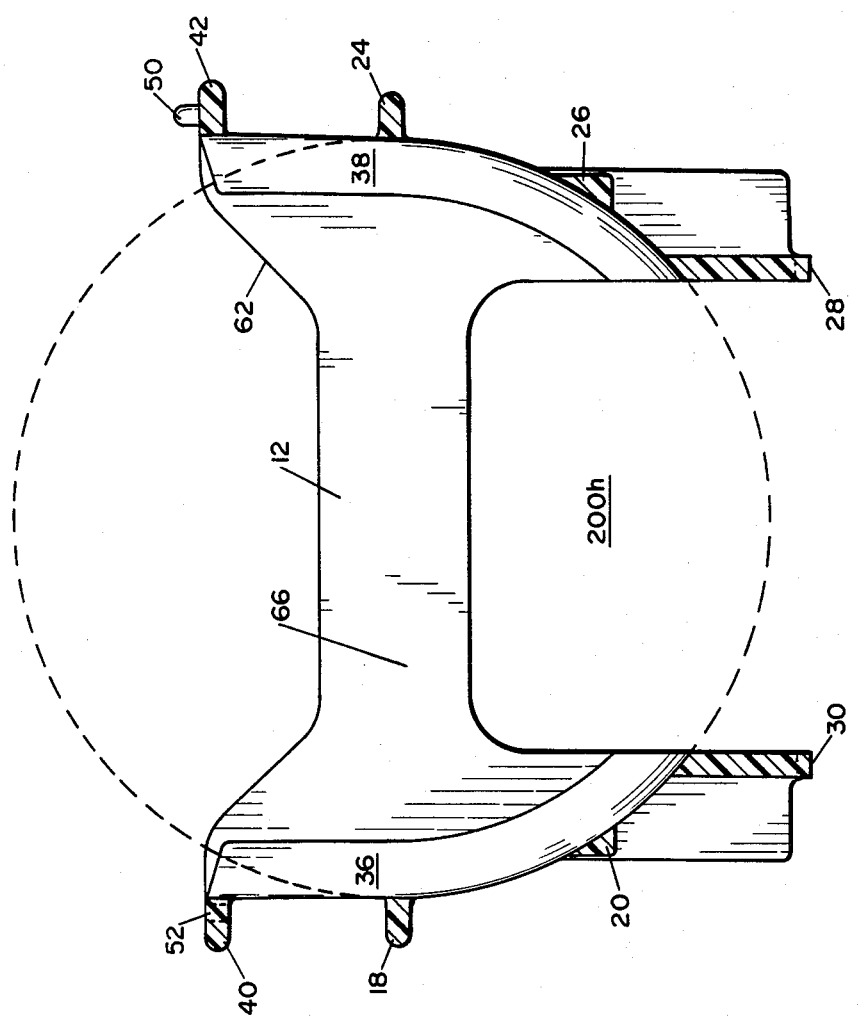
FIG. 5 illustrates a view taken along line 5—5 of FIG. 2.

FIG. 5 particularly illustrates a view taken along line 5—5 of FIG. 2 showing the point contact as well as perimeter contact to the edges of the wafer disk which is minimized for purposes of processing by automated equipment.

In this invention, the dividers supporting the wafers are supported by structure providing for maximized open area for such automated processing steps such as dunking or emersion, spraying or washing process steps. Fluids as well as air or gaseous vapors can pass through the open areas of the dividers and about the open ends. The cassette 10 is able to withstand chemicals such as sulfuric acid or diluted acid, or solvents such as Freon.

The partial cross-sectional area of the H-bar provides for least weight of the cassette, as well as structual integrity. The wafer processing cassette will carry twenty-five wafers, or any other number of wafers as so configured.

Various modifications can be made to the present invention without departing from the apparent scope thereof. The H-bar can be a continuous partial cylindrical rod in lieu of the H-bar as disclosed in FIG. 3.

Having thus described the invention, what is claimed is:

1. Wafer cassette comprising:
    a. plurality of opposing wafer dividers, each of said dividers including a rounded tooth geometrical configuration and being substantially rounded along the perimeter of a wafer for encompassing and conforming to the circumference of a wafer;
    b. upper and lower opposing longitudinal horizontal supports supporting said wafer dividers;
    c. plurality of opposing upper and lower edge members and opposing rounded vertical side members for supporting said wafer dividers;
    d. rear-end member including a substantially downward arch providing an open top portion and secured to said side members; and,
    e. open H-bar end front member, said H-bar end including opposing vertical reinforcing edge members, a horizontal H-bar member running therebetween, said horizontal H-bar member including a reinforcing sectioned cylindrical rod, a reduced cross-sectional portion therebetween, and an upper ramped portion and a lower rounded open portion about said H-bar whereby said open area of said H-bar end, said rear end, and between said wafer dividers divides for structural integrity and non-restricted open surface automated processing of wafers, thereby providing a structurally integral wafer cassette for integrated circuit automated processing of said wafers in a wafer cassette.

2. Wafer cassette of claim 1 wherein said H-bar member comprises a partial cylindrical rod of reduced cross-sectional area.

3. Wafer cassette of claim 1 wherein said dividers will accommodate twenty-five wafers.

* * * * *